United States Patent [19]

Carroll, II et al.

[11] 4,439,918

[45] Apr. 3, 1984

[54] METHODS OF PACKAGING AN ELECTRONIC DEVICE

[75] Inventors: Arthur E. Carroll, II, Raytown, Mo.; Basil C. Lewis, Jr., Reading, Pa.; Howard T. Yeazel, Leawood, Kans.

[73] Assignees: Western Electric Co., Inc.; Bell Telephone Laboratories, Inc., both of New York, N.Y.

[21] Appl. No.: 375,943

[22] Filed: May 7, 1982

Related U.S. Application Data

[62] Division of Ser. No. 19,543, Mar. 12, 1979, Pat. No. 4,346,396.

[51] Int. Cl.³ .............................................. H05K 3/34
[52] U.S. Cl. .................................. 29/840; 29/576 S; 29/588; 228/180 A
[58] Field of Search ................... 29/576 S, 588, 827; 228/180 A; 206/330

[56] References Cited

U.S. PATENT DOCUMENTS

| | | |
|---|---|---|
| 2,897,419 | 7/1959 | Howland et al. |
| 2,906,930 | 9/1959 | Raithel |
| 3,325,882 | 6/1967 | Chiou et al. ............ 29/576 S X |
| 3,480,836 | 11/1969 | Aronstein ............ 228/180 A X |
| 3,532,944 | 10/1970 | Ollendorf et al. |
| 3,569,797 | 3/1971 | Simmons |
| 3,606,673 | 9/1971 | Overman |
| 3,627,901 | 12/1971 | Happ |
| 3,650,232 | 3/1972 | Heinlen |
| 3,675,089 | 7/1972 | Hantusch et al. |
| 3,680,206 | 8/1972 | Roberts |
| 3,691,628 | 9/1972 | Kim et al. ............ 29/588 X |
| 3,735,017 | 5/1973 | Manning |
| 3,736,367 | 5/1973 | Heinlen et al. |
| 3,860,949 | 1/1975 | Stoeckert et al. |
| 3,871,008 | 3/1975 | Debesis |
| 3,871,014 | 3/1975 | King et al. |
| 3,902,189 | 8/1975 | Simpson |
| 3,967,366 | 7/1976 | Birglechner et al. ............ 228/180 A |
| 4,032,706 | 6/1977 | Paletto |
| 4,059,810 | 11/1977 | Paletto |
| 4,124,864 | 11/1978 | Greenberg |
| 4,142,288 | 3/1979 | Flammer et al. |
| 4,152,175 | 5/1979 | Burgess et al. |
| 4,209,355 | 6/1980 | Burns ............ 29/576 S X |

FOREIGN PATENT DOCUMENTS

| | | |
|---|---|---|
| 264443 | 8/1963 | Australia |
| 2003423 | 9/1971 | Fed. Rep. of Germany |
| 2818080 | 11/1978 | Fed. Rep. of Germany |
| 2232081 | of 1974 | France |
| 1149969 | 4/1969 | United Kingdom |
| 1210584 | 10/1970 | United Kingdom ............ 29/588 |

OTHER PUBLICATIONS

IBM Tech. Discl. Bull., vol. 16, No. 3, Aug. 1973, p. 758 by VanVestrout.
IBM Tech. Discl. Bull., vol. 20, No. 10, Mar. 1978, p. 3903 by Magdo.
IBM Tech. Discl. Bull., vol. 22, No. 2, Jul. 1979, p. 522.
Electronic Packaging & Production, p. 62, Jan. 1972.
IBM Tech. Discl. Bull., vol. 2, No. 6, Apr. 1960, p. 69 by Dunkel.
IBM Tech. Discl. Bull., vol. 8, No. 3, Aug. 1965, p. 380 by Miller.
IBM Tech. Discl. Bull., vol. 10, No. 5, Oct. 1967, p. 657 by Miller et al.
IBM Tech. Discl. Bull., vol. 14, No. 11, Apr. 1972, p. 3332 by Dunkel.

Primary Examiner—Howard N. Goldberg
Assistant Examiner—Carl J. Arbes
Attorney, Agent, or Firm—W. O. Schellin

[57] ABSTRACT

An electronic device assembly (11) includes a heat dissipating substrate (18) having a seat (16). A device (14) is uniformly spaced from a base surface of the seat (16), and a layer of solder of uniform thickness occupies a gap between the surface of the seat and the device. Leads (31) and (33) extend at a shallow, acute angle from the device. A lead (32) is mounted to a support (28) extending from the substrate (18). Inner portions of the leads (31, 32, 33), the device (14) and portions of the substrate (18), are encased by an envelope (22), while outer portions (67) of the leads and a mounting tab (19) of the substrate extend from the envelope.

4 Claims, 6 Drawing Figures

METHODS OF PACKAGING AN ELECTRONIC DEVICE

This is a division of application Ser. No. 19,543, filed Mar. 12, 1979 now U.S. Pat. No. 4,346,396 issued Aug. 24, 1982.

TECHNICAL FIELD

This invention relates to an electronic device assembly and to methods of making such an assembly. The invention is particularly applicable to a semiconductive power device such as a power transistor. However, the description of the invention with respect to a power transistor is for illustrative purposes only, since it will be recognized from the detailed description that the advantages and features of the invention are useful with respect to other electronic devices as well.

BACKGROUND OF THE INVENTION

Power transistors operate with heat losses. Since semiconductive materials are heat sensitive and semiconductive device parameters tend to vary significantly with temperature when they overheat, it is a common practice to mount power transistors to heat sinks. Typically, a transistor chip is mounted to a relatively large heat sink which is part of the transistor package. The heat sink of the package in turn, becomes mounted to a heat conductive radiator or dissipator such as a relatively large plate. In spite of the various heat sink provisions, power transistors operate at relatively high temperatures at which the outflowing heat equals the heat generated by the operation of the transistors.

In addition to operating at relatively high temperatures, the transistors are thermally cycled when they operate intermittently. Large transistors subjected to thermal cycling tend to fail by material fatigue. Common failure modes include such failures as cracking of chips, a separation of the leads from the chips or a separation of the chips from their heat removing substrates. Such problems indicate a desirability for mounting a semiconductor device chip in a package which readily transmits heat from the chip to an external heat sink. For such a device package to meet desired reliability standards, the package should also withstand thermal cycling, as well as prolonged operation at elevated temperatures.

In the past, power transistor chips, for example, have been mounted to heat sink headers by solder bonds. The problem with a chip bonded by a thin layer of solder to a heat conductive header has been one of stressing the bond and the chip as a result of an inherent mismatch between the thermal expansion coefficient of the transistor chip and that of its header. Typically, the heat conductive header is a relatively thick copper part. The coefficient of thermal expansion of copper, however, is different from that of the silicon material of the chip. Consequently, temperature changes in the package tend to cause stresses at the interface between the chip and its header.

The prior art also shows attempts related to improving the attachment of the external leads to the chip and to the header. Unitary lead frame-header structures offer advantages in the preparation of such structures prior to the assembly of chips to the structures. However, there are disadvantages in assembling the chips to such unitary structures. Each of the structures has leads which are already formed in place with respect to the header, and one of the chips has to be inserted between the leads and the header. There is a tendency to damage the chip at that point.

Also, since the header is desirably of a thicker stock than the leads, the headers are often chosen to be of a material stock different from that of the leads. It is therefore already known to assemble the relatively thinner leads to the relatively thicker header. One known method to assemble an initially two piece header-lead frame structure involves staking a collector lead to a heat sink header. Many of presently known transistor packages, however, retain problems which limit the lives of the transistors under actual operating conditions.

It is, therefore, an object to provide a thermally stable transistor package.

It is a further object to provide methods for assembling such a thermally stable transistor package.

SUMMARY OF THE INVENTION

This invention contemplates an electronic device package which includes at least one device. The device has a mounting surface. A substrate is located with respect to the device to have a surface adjacent to the mounting surface of the device. The device and the substrate are uniformly spaced from each other by a gap of a predetermined width. The gap is occupied by a substance, such as solder, which mounts the device to the substrate. In a preferred embodiment, the width of the gap is chosen to optimize heat transfer and stress characteristics across the gap.

This invention also contemplates a method of packaging an electronic device. An electronic device is spaced from a substrate by a uniform, predetermined distance to form a gap between the device and the substrate. The gap is filled with a hardenable substance, such as solder, which is hardened to thereby mount the device in the position.

BRIEF DESCRIPTION OF THE DRAWING

The features and various advantages of the invention will be better understood from the detailed description when read in conjunction with the accompanying drawing, wherein.

DETAILED DESCRIPTION

Figure 1:
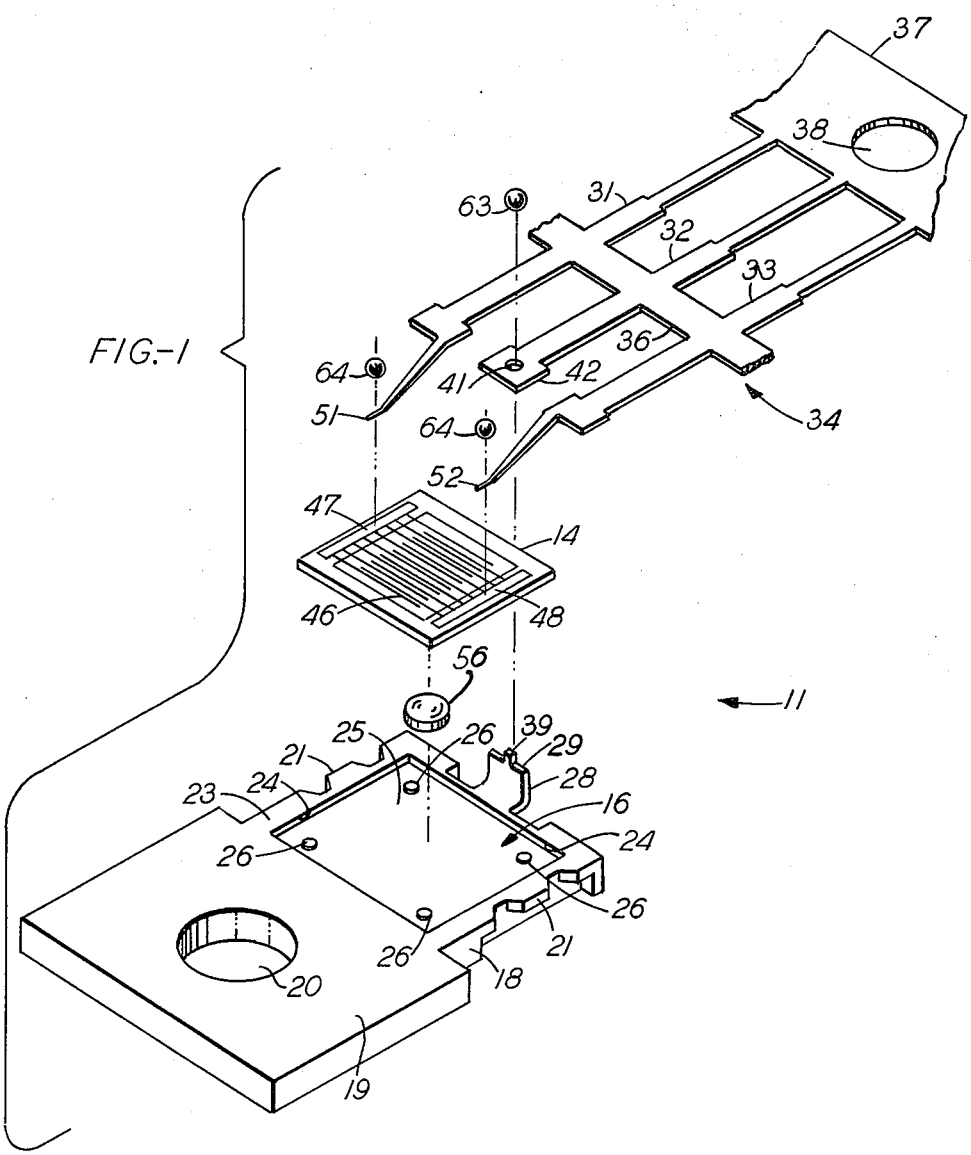
FIG. 1 is an exploded, pictorial view of an electronic device package, showing features of this invention.

FIG. 1 shows a pictorial view of separate elements of an electronic device assembly or package, designated generally by the numeral 11. An electronic device, such as a power transistor chip 14 is in vertical alignment with a seat 16 on a substrate 18.

The substrate 18 is preferably although not necessarily of a copper alloy which is commonly referred to as CDA 155. The heat conductivity of the alloy material is intended to draw heat away from the chip 14 and out of the package 11. The heat is dissipated from an underside (not shown) which is typically though not necessarily flat. Also a mounting tab 19 of the substrate 18 is provided with an aperture 20. The package 11 may be mounted by the tab 19 to yet another heat conducting or heat dissipating element to which the flat underside of the substrate 18 provide a convenient interface (not shown). A flat metallic outer mounting surface with an aperture or a slot, such as the tab 19 with the aperture 20, to mount the surface by means of a screw against a heat sink, is well known in the prior art. Also, swaged or coined lateral protrusions 21 are commonly used to securely bond a molded plastic housing or envelope 22 (see FIG. 2) to the substrate 18.

Referring again to FIG. 1, the substrate 18 is coined in the area of the seat 16 to form the seat as a depression or cavity below an inner, flat surface 23 of the substrate 18. The seat 16 is bounded by a retaining ledge 24. Preferably, the seat 16 is coined approximately 0.4 mm larger in each direction than a corresponding edge of the chip 14. The larger size of the seat 16 offers a sufficient clearance for the chip 14 to be located on the seat 16 in a semi-automatic assembly method without possible interference from the ledge 24 of the seat 16.

Figure 2:
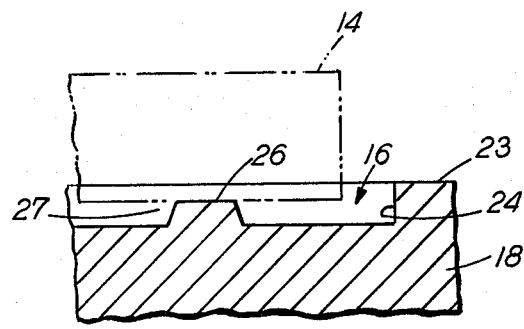
FIG. 2 shows an enlarged partial section through a substrate of the package in FIG. 1.

A bottom surface 25 of the seat 16 is substantially flat. The surface 25 thereby matches a flat underside of the chip 14. However, a number of pedestals 26, preferably four, extend from the surface 25. As shown in FIG. 2, the chip 14 upon being placed on the seat 16, rests against the pedestals 26. The pedestals 26 are of substantially equal height. Thus after being solder-bonded to the seat 16, as in the assembled package 11 of FIG. 3, the chip 14 is uniformly spaced from the surface 25 by a distance determined by the height of the pedestals 26. The uniform space between the chip 14 and the underlying surface 25, when occupied by solder for mounting the chip, is believed to distribute thermally generated stresses between the chip 14 and the substrate 18, thereby increasing the reliability of the package 11 as a unit.

The pedestals 26 have been found to be a preferred structure for uniformly spacing the chip 14 by a predetermined distance from the surface 25. It is, of course, realized that a gap 27 could be obtained by spacing the chip in different ways. It would be possible, for example, to temporarily hold the chip 14 in relationship to the substrate 18 by a fixture until after the chip has been solder-bonded. However, the preferred structure of the substrate including the pedestals is believed to be particularly advantageous in the assembly of the package 11 and in increasing the reliability of the packages assembled in this manner.

In FIG. 2 the relationship of the height of the pedestals 26 to the depth of the seat 16 is shown in greater detail. The height of the pedestals 26 above the surface 25 is approximately 0.075 mm, while the depth of the cavity of the seat 16 is approximately 0.05 mm greater than the height of the pedestals 26 above the surface 25 of the seat. Consequently, when the chip 14 is located on the pedestals 26, the ledge 24 extends slightly above the base of the chip 14. It is pointed out, however, that the ledge 24 is not used for locating or retaining the chip 14 with respect to the substrate. Instead, the site of the seat 16, being somewhat larger than the chip 14, forms a moat about the chip. Solder typically fills the moat when the chip 14 becomes assembled to the substrate 18.

A formed lead support 28 (FIG. 1), located adjacent to the seat 16, terminates in a platform 29. The platform 29 may be used as a support surface or guide for locating leads 31, 32 and 33 at a predetermined level above the inner surface 23 of the substrate 18. In FIG. 1 the leads 31, 32 and 33 are shown as part of an interconnected lead frame 34. In the preferred embodiment, the lead frame 34 includes a tie bar 36 and an apertured end strip 37. The tie bar 36 and the strip 37 not only retain the leads 31, 32 and 33 in a desired relationship with each other as a group, but also interconnect adjacent groups into a strip. Apertures 38 in the end strip 37 can be used to advance the frame 34 during manufacturing operations, and to locate the leads 31, 32 and 33 during their assembly into the package 11. After the envelope 22 has been molded, the tie bar 36 and the strip 37 are removed from the leads 31, 32 and 33 during cutting and trimming steps which typically complete the assembly process.

The support 28 is preferably formed as an integral part of the substrate 18. A short stub portion of the substrate is preferably machined into a section thinner than the thickness of the substrate 18. The machined portion is then formed through a right angle. The end of the formed position constitutes the platform 29. A pin 39 in the center of the platform 29 fits through a corresponding aperture 41 at an inner end 42 of the lead 32. An insertion of the pin 39 through the aperture 41 provides a mechanical interdigitation as a basis for a strong solder joint between the lead 32 and the substrate 18. After soldering and prior to molding the envelope 22 the solder joint of the lead 32 maintains the lead frame 34 in position with respect to the substrate.

Figure 3:
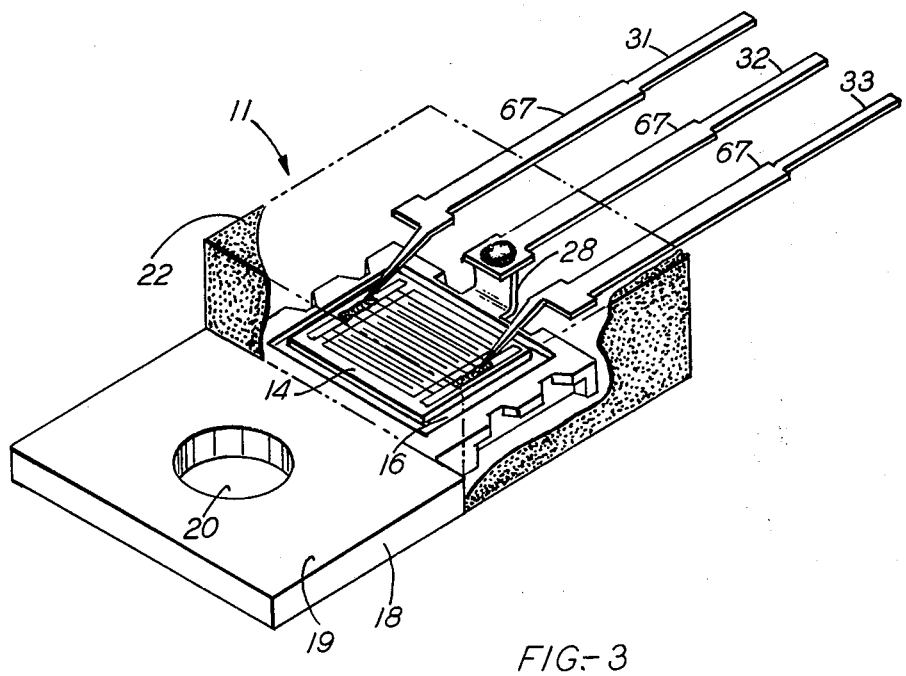
FIG. 3 is an assembly of the package of FIG. 1 with portions of an envelope cut away to show details of the assembly.

In assembling the package 11 shown in FIG. 3, the elements of FIG. 1 are mechanically joined. A condition which may contribute to an occasional damage to the chip during the assembly of the package is the vulnerability of an active surface 46 (FIG. 1) of the chip 14. Semiconductor junctions formed near the active surface can be damaged by scratching the surface 46 at the time when the chip 14 is assembled into the package 11. Nevertheless, electrical contact pads on the active side of the surface need to be connected to the more robust leads which are then used to connect the assembled package to external circuitry. Consequently, the chip 14 needs to be mounted and electrically coupled to the substrate 18, and the leads 31 and 33 need to be coupled to circuit terminations on the active surface 46.

Two contact pads 47 and 48 on the active surface 42 are spaced in relationship to ends 51 and 52 of the respective leads 31 and 33. The ends 51 and 52 have a long, slender taper in both the vertical and in the horizontal plane. The taper and a slight bend of the ends 51 and 52 permit a gentle contact between the underside of each end 51 or 52 and the corresponding pad 47 or 48 when the lead frame 34 is aligned to be assembled to the substrate 18 and to the chip 14. The predetermined spacing of the lead frame 34 with respect to the substrate 18 causing the leads to be located slightly above the active surface 46 of the chip 14 permits the leads 31 and 33 to approach the contact pads 47 and 48 at a rather small angle to limit the amount of plastic which become located between the leads 31 and 33 and the chip 14. It has been found that such a limitation tends to minimize stresses on the solder bonds between the ends 51 and 52 and the contact pads during heat cycling of the package 11.

It is preferred to assemble the elements of the package 11 shown in FIG. 1 in two distinct soldering steps. First, the chip 14 is soldered to the substrate 18. Thereafter, the lead frame 34 is soldered as a unit to the substrate 18 and to the contact pads 47 and 48 on the active surface of the chip 14. Advantages have been found in features of the structure of the various mechanical elements of the package 11 for a practical two-step solder operation.

Referring to FIG. 1, a solder preform 56 is initially placed onto the seat 16. In the preferred embodiment, the solder preform 56 has the shape of a flattened sphere or a disc. The flat surfaces on the preform 56 permit the preform 56 to stay in place on the seat 16, once having been placed thereon, approximately in the center between the pedestals 26. The preform 56 has a thickness of about 0.4 mm and a diameter of about 1.6 mm.

The chip 14 is then spaced with its backside, namely, the surface opposite the active surface 46, against the exposed surface of the preform 56. Until the chip 14 becomes solder-bonded to the seat 16, the chip 14 is preferably retained from moving in its lateral plane parallel to the seat. In addition, a vertical force is applied to the chip 14 to urge the chip toward the substrate 18 and toward the seat while the substrate 18, the preform 56 and the chip 14 are being heated to cause the solder of the preform 56 to melt and flow.

The solder of the preform 56 is preferably a 5-95 tin-lead solder alloy containing substantially 5 percent of tin and 95 percent of lead. The 5-95 solder alloy is preferred for its fatigue resistance, its softness, e.g., its capacity to form a compliant bond between the chip 14 and the substrate 18 and for its acceptable, relatively high melting point of 318° Celsius. To actually melt the preform 56, the assembled structure is placed into a reflow type solder furnace, such as a hydrogen belt furnace made by Watkins-Johnson Co., Inc. (not shown), and heated to a temperature of approximately 340° Celsius. The furnace melts the preform 56 and maintains the solder in its liquid state for about 60 seconds before it solidifies.

The melting of the solder permits the chip 14 to settle under the urging of the applied vertical force and rest against the pedestals 26. FIG. 2 shows the pedestal 26 in greater detail. As referred to above, the height of the pedestals 26 above the surface 25 is about 0.075 mm. The tops 58 of the pedestals 26 are about 0.13 to 0.20 mm in diameter. The diameter of the pedestals at the surface 25 of the seat is about 0.25 mm. These dimensions are not considered to be critical but have been found to be advantageous in the presently described embodiment.

As the chip 14 becomes positioned on the pedestals 26, the surface of the chip facing the seat 16, being substantially uniformly spaced from the surface 25 forms the gap 27 of a width determined by the height of the pedestals 26. The amount of solder in the preform 58 is based on the volume of the gap 27. The amount of solder is preferably chosen so that after melting and flowing it completely occupies and fills the gap 27. Upon cooling the solder solidifies and bonds the chip 14 to the substrate 18, thereby fixing the relative position of the chip 14 to the seat 16 and the pedestals 26 thereon. The preform 56 is further preferred to at least nominally include an excess of solder. The excess solder occupies the moat or peripheral area of the seat 16 about the chip 14 after the solder has flowed and the chip 14 has settled to rest against the pedestals 26.

Referring again to FIG. 1 in the further assembly of the package 11, the lead frame 34 is bonded to the substrate 18 and the chip 14. Prior to bonding the lead frame 34, the substrate 18 and the lead frame 34 are brought into a desired alignment with respect to each other. The pin 39 at the end of the platform 29 is inserted through the aperture at the end of the lead 32, and the leads 31 and 33 are brought into contact with the respective pads 47 and 48 on the chip 14.

Preferably solder preforms 63 and 64 are used to measure a correct amount of solder for permanently attaching the lead 32 to the platform 29 and the leads 31 and 33 to their respective pads 47 and 48. Advantageously, but not necessarily, the material composition of the solder preforms 63 and 64 is the same as that of the preform 56 used to bond the chip 14 to the substrate 18. Similar to the previous bonding operation, the mechanical assembly of the substrate 18 with the chip 14 and the lead frame 34 is placed into the solder reflow furnace (not shown), wherein the assembly is again heated to a temperature of 340° Celsius for a period about 60 seconds. After solidification of the solder, lead frame 34 has been joined to the chip 14 and the substrate 18.

Besides completing the solder operations on the package 11, this second solder operation is believed to have an additional advantage in that at least a softening, but most likely a reflow of the previously applied solder between the chip 14 and the substrate 18 takes place. During this reflow the chip 14 is retained in place between urging vertical forces exerted through the leads 31 and 33 and the pedestals 26. The softening and reflow of the solder from the first solder operation is believed to result in a stress relieving operation on the bond between the chip and the substrate 18 which may at least partly contribute to the relatively long useful life of the package 11.

To aid in the wetting of the elements to be soldered, the affected surfaces are preferably coated with a thin layer of gold. A barrier layer of nickel between the gold and the copper prevents diffusion of the gold into the copper. The layer of gold does not oxidize and prevents the underlying base material from becoming oxidized to promote the solderability of the pads and the leads. But gold is also known to readily go into solution with the solder to form a gold alloy. The presence of gold in relatively small concentrations is known to render the solder unsuitably brittle through the formation of intermetallic compounds. Such a brittleness may be noted already, for instance, when the gold contents approaches a concentration of 2-5% only in the solder. Understandably, the amount of gold dissolving into the solder desirably minimized to a concentration well below that range by coating the elements to be soldered to a thickness of gold which will merely promote its solderability, typically about 0.5 um gold ($0.5 \times 10^{-6}$ m), and by using a sufficient amount of solder in contact with the gold. Minimizing in addition the time period during which the solder in its liquid phase is exposed to the nickel layer or to the underlying base metals prevents a formation of other unwanted and possibly harmful intermetallic compounds between the constituents of the solder and any metals of the surfaces to be soldered.

After the bonds have been made, the assembly of the package 11 is completed by molding the plastic envelope 22 (FIG. 3) about the chip 14 and about the portion of the leads 31, 32 and 33 located adjacent to the chip 14. The envelope 22 securely grasps the protrusions 21 on both sides of the substrate 18. In addition to protecting the chip 14 from damage, the envelope 22 provides a mounting or anchoring base to the leads 31, 32 and 33. The end of each of the leads 31, 32 and 33 has a rectangular anchor which becomes securely lodged within the bulk of the plastic molded material of the envelope 22 to prevent bending stresses on the outer portions 67 of the leads from being transmitted to the inner solder connections of the leads 31, 32 and 33 with the substrate 18 and particularly with the chip 14. Being firmly anchored in the molded envelope 22 each of the leads 31, 32 and 33 is capable of supporting itself in its respective position. Consequently, after the envelope is molded about the chip 14, the tie bar 36 and the apertured end strip 37 is severed from the leads 31, 32 and 33 to permit them to be mechanically and electrically independent, as shown in FIG. 3. In the preferred embodiment of a power transistor, the lead 31 is soldered to the emitter on the chip 14, the lead 33 is soldered to the base on the chip, and the underside of the chip is its collector. Therefore, the lead 32 is electrically coupled through the substrate 18 to the collector terminal of the chip 14.

Figure 4:
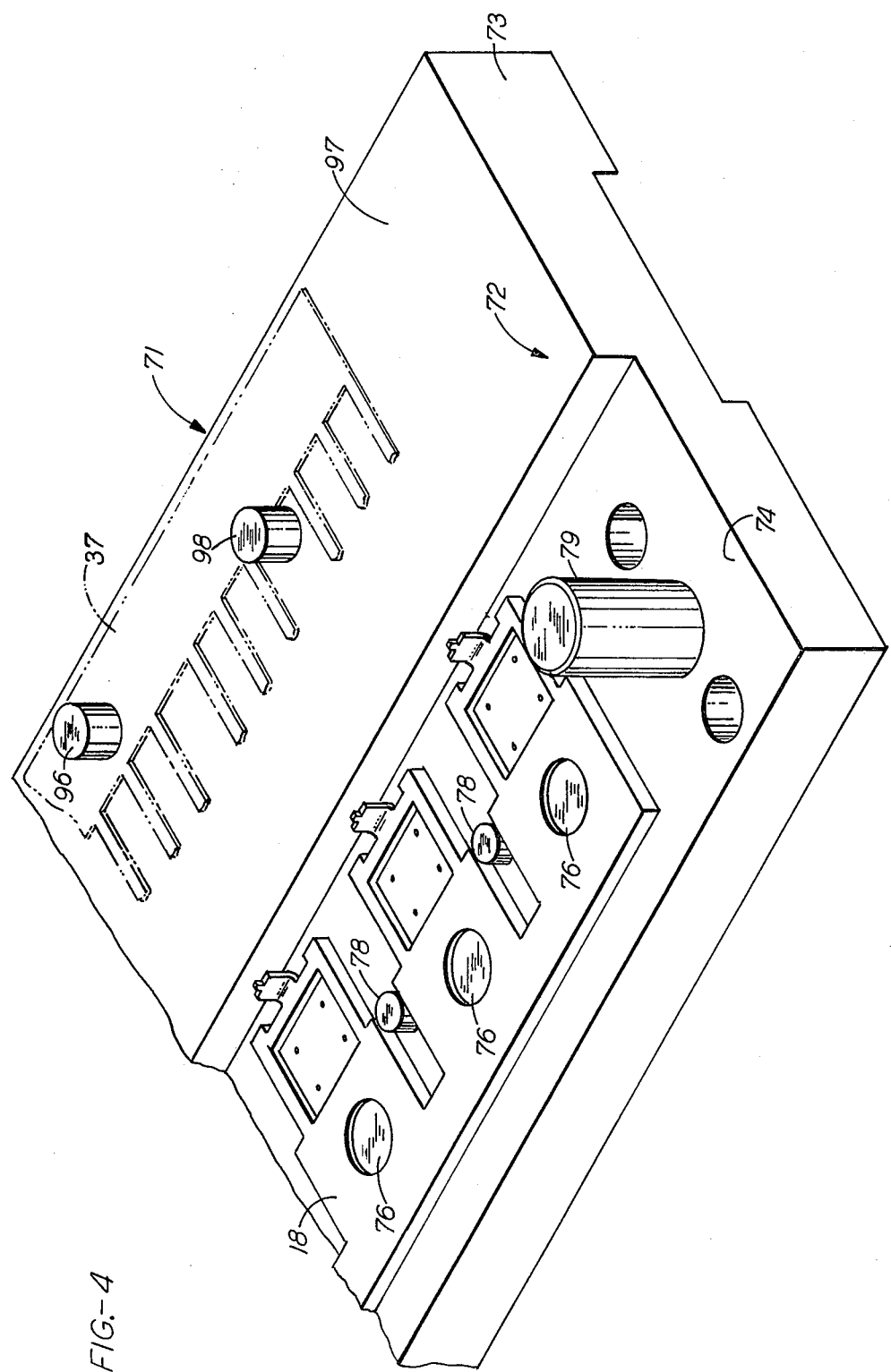
FIG. 4 shows an apparatus used for assembling elements of the package of FIG. 3.

An assembly sequence has been described relating to the assembly of a single one of the packages 11. The described sequence is employed in a preferred method in which a group or a lot of the packages 11 are assembled simultaneously. The preferred method is but one of a number of efficient assembly methods within the scope of the present invention. According to the preferred method, a lot of 15 of the described elements is simultaneously subjected to the soldering sequence. FIG. 4 shows an apparatus 71 which is used in holding the substrate 18 and the frame 34 (refer to FIG. 6) of each package 11 within the lot in relationship to each other. The apparatus 71 provides a substantially flat, but stepped, assembly surface 72 on a body 73 of ceramic material or graphite material, such as, for instance, a material available under the name of "POCO Graphite."

On a lower step 74 of the surface 72, pins 76 are uniformly spaced in a single row to accept the apertures 20 of a strip of the substrates 18. The pins 76 have a precise height above the lower step, the height being slightly less than the thickness of the substrate 18. Because a single, long strip of the substrates 18 tends to warp or bow when it is heated during the described soldering steps, three separate strips, each consisting of five interconnected substrates 18 (three of which are shown in FIG. 4), are loaded onto the lower step 74 of the surface 72, as shown in FIG. 4. Spacer pins 78 help to align the substrates 18 on the lower step 74 and to keep them aligned while the substrates 18 are being heated during the soldering steps.

Figure 5:
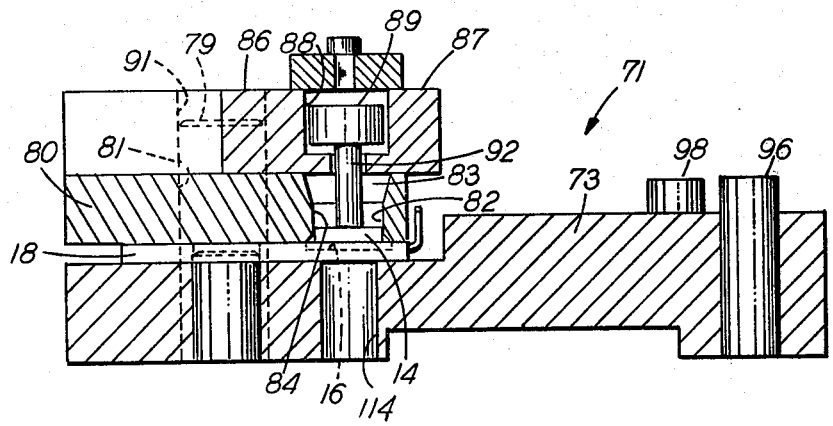
FIG. 5 shows an end view of the apparatus of FIG. 4 with an additional guide element after the package has undergone a first solder step.

Referring now to FIG. 5, there is shown a sectional end view of the apparatus 71 of FIG. 4. Guide pins 79 at each end of the body 73 (only one of the ends being shown in FIG. 4) locate a chip guide 80 over and in contact with the already loaded substrates 18. The pins 79 match guide holes 81 at each end of the chip guide 80. Funnel-like apertures 82 through the body of the guide 80 are linearly located to position each one of the apertures 82 in vertical alignment over a respective one of the seats 16 of the substrates 18. The preforms 56 (not shown in FIG. 5) are first positioned on the seats 16 by dispensing one preform through each of the apertures 82. Thereafter, one of the chips 14 is placed onto each of the preforms 56. The flattened surfaces of the preforms 56 maintain the chips 14 in a substantially horizontal orientation above the seat 16.

An upper funnel 83 of each aperture 82 is generated by an initial 15° taper of the walls 84. The walls 84 adjacent to the funnel 83 are vertical and are spaced to restrain lateral movement of the chip 14, except for a small clearance to permit the chip 14 to slide vertically through the aperture 82. After the chips 14 have been placed into the apertures 82, the chips are preferably weighted down to urge them toward the pedestals 26.

A chip weight holder 86 is consequently placed over the chip guide 80 after the chips 14 have been placed through the apertures 82. The holder 86 has a long straight body 87 with properly spaced guide cavities 88 to position one weight 89 located in each of the guide cavities 88 above the chip 14 in each of the apertures 82. A locator hole 91 at each end of the weight holder 86 matches the guide pins 79 to bring about the desired alignment of the weights 89 above the chips 14. The weights 89 are capable of vertical sliding movement within the cavities 88. A lower extension 92 of each weight 89 rests against the upper surface of the chip 14. Prior to soldering the chip 14 to the substrate 18, the weight is lifted from the bottom of the cavity 88 by about the thickness of the solder preform 56. When the solder of the preform melts, the weight 89 moves substantially to the bottom of the cavity 88, as the extension 92 urges the chip 14 against the pedestals 26.

Figure 6:
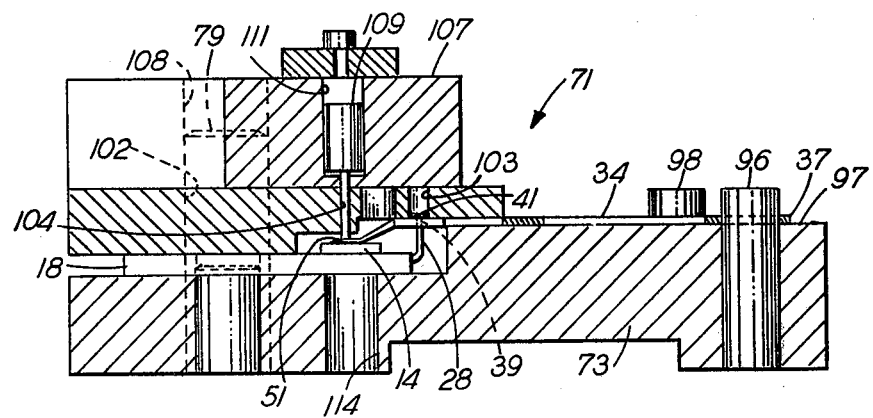
FIG. 6 shows an end view of the apparatus of FIG. 4 with a different guide element after the package has undergone an additional solder step.

After the chips 14 have been soldered to the substrates 18, the weight holder 86 and the chip guide 81 are removed from the apparatus 71. The substrates 18 remain in place on the apparatus 71. An appropriate number of the lead frames 34 are placed onto the apparatus 71 and properly positioned with respect to the substrates 18 as shown in FIG. 6. Guide pins 96 extending from an upper step 97 of the apparatus 71 match the apertures in the end strip 37. Spacer pins 98 between some adjacent groups of the leads 31, 32 and 33 align the leads while permitting thermal expansion of the strip. Using three different strips of five lead frames 34 minimizes any bowing of the lead frames 34 and any unwanted misalignment of the ends 51 and 52 during the second soldering step. When the lead frames 34 are properly positioned, the apertures 41 in the leads 32 are placed over the respective pins 39 extending from the platforms 29 of the substrates 18. The lead ends 51 and 52 of each frame rest against the respective contact pads 47 and 48.

As shown in FIG. 6, a solder guide 101 is placed over the substrates 18 and the lead frames 34. To align the solder guide 101 to the apparatus 71, the guide 101 also uses the guide pins 79 which mate with a guide hole 102 at each end of the guide 101. The solder guide 101 has several functions; it holds down the substrates 18 and the frames 34, and it precisely locates the points at which the solder preforms 64 and the solder preform 63 (not shown in FIG. 6) are brought into contact with the leads 31 and 33 and with the lead 32, respectively. The solder guide 101 has a substantially straight body, also formed of a graphite material. Apertures 103 and 104 provide the necessary access to accurately place solder preforms 63 and 64.

A lead weight holder 107 is placed over the solder guide 101. Alignment holes 108 at each end of the holder 107 also mate with pins 79 to align the holder 107 to the remainder of the apparatus 71. An appropriate number of weighted rods 109 extend from the weight holder 107 through the apertures 104 and bear against the preforms 64 and against the ends 51 and 52 of the leads 31 and 33 to urge the ends 51 and 52 against the respective contact pads 47 and 48. The weighted rods 109 are guided along cylindrical cavities 111 in the body of the holder 107, similar to the manner in which the weights 89 are guided by the cavities 88 in the weight holder 86. The functions of the weighted rods 109 is to urge the solder preform 64 into contact with the leads 31 and 33. Weights 112 located in the cavities 111 are chosen to exert sufficient force against the solder preforms 64 to perform the desired function. The precise weight depends, of course, on the size of the preforms, which in turn depends on the size of the leads and the contact pads.

Held in position in the described manner by the solder guide 101 and by the weight holder 107, the assemblies of the substrates 18 and the lead frames 34 are now heated to melt the solder preforms 63 and 64. Significantly, the pressure by the leads 31 and 33 against the chip 14 aided by the weighted rods 109 retains the chip 14 in place with respect to the substrate 18, even though the solder applied during the previous solder step may melt again. Because the chips 14 rest against the pedestals 26 during the second solder operation, the position of the chip 14 with respect to the substrate 18 remains fixed throughout the second solder operation. Also, it has been found that the solder connection of the inner end 42 of the lead 32 to the lead support 28 is more rigid and stronger than the portions of the lead 32 adjacent to the bonded connection. Consequently, the solder connection of the lead 32 to the support 28 does not become subjected to an excessive amount of stress during subsequent handling of the soldered assemblies prior to molding. After the second solder operation has been completed, the soldered assemblies can be, if so desired, more readily removed from the apparatus 71 by exerting a stripping force through apertures 114 which are located underneath each of the assemblies. The soldered assemblies undergo as a final assembly step a typical molding operation to form the envelopes 22.

The present invention has been described by way of a specific illustrative example. It becomes apparent from the above description, that various changes and modifications can be implemented on the disclosed subject matter without departing from the spirit and scope of the present invention. The invention is intended to be limited only by the scope of the appended claims.

What is claimed is:

1. A method of packaging an electronic device comprising:
   spacing an electronic device by pedestals having a predetermined height above a surface of a substrate, thereby positioning the device a predetermined distance from the substrate to form a gap between the device and the substrate;
   filling the gap with a hardenable substance;
   retaining an excess of the hardenable substance in a moat on the substrate about the device and in communication with the gap; and
   hardening the substance, the substance adhering to the device and to the substrate to bond the device to the substrate, the substance retaining the capacity to shift between the moat and the gap during hardening to minimize bonding stresses between the device and the substrate.

2. A method of packaging an electronic device according to claim 1, wherein spacing the device comprises:
   urging the device against the pedestals until after the substance has hardened.

3. A method of packaging an electronic device according to claim 2, wherein the hardenable substance is solder, and filling the gap with a hardenable substance comprising:
   positioning a solder preform of a predetermined size between the substrate and the device; and
   then heating the substrate, the device and the solder preform to a temperature above the melting point of the solder during the urging step.

4. A method of packaging an electronic device comprising:
   spacing an electronic device by a predetermined distance from a substrate to form a gap between the device and the substrate;
   providing solder for forming a substantially continuous layer of solder in the gap between the device and the substrate to bond the device to the substrate in a first solder-bonding operation and providing an excess of said solder;
   retaining said excess of solder in a moat peripherally about the device in communication with the layer of solder in the gap; solder-bonding the electronic device to the substrate, the solder retaining the capacity to shift between the moat and the gap during said bonding and
   attaching at least one lead to an upper surface of the device in a second solder-bonding operation while retaining the device in a spaced position in relationship to the substrate under an urging force exerted through the lead against the device.

* * * * *